(12) United States Patent
Maruyama et al.

(10) Patent No.: US 9,673,117 B2
(45) Date of Patent: Jun. 6, 2017

(54) SEMICONDUCTOR MODULE (71) Applicant: FUJI ELECTRIC CO., LTD., Kawasaki-shi (JP)

(72) Inventors: Rikihiro Maruyama, Matsumoto (JP); Takahito Harada, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/990,423

(22) Filed: Jan. 7, 2016

(65) Prior Publication Data
US 2016/0118310 A1   Apr. 28, 2016

Related U.S. Application Data (63) Continuation of application No. PCT/JP2014/082632, filed on Dec. 10, 2014.

(30) Foreign Application Priority Data

Jan. 17, 2014   (JP) .................................. 2014-006436

(51) Int. Cl.
*H01L 23/053*   (2006.01)
*H01L 23/28*   (2006.01)
(Continued)

(52) U.S. Cl.
CPC ............ *H01L 23/053* (2013.01); *H01L 21/52* (2013.01); *H01L 23/08* (2013.01); *H01L 23/24* (2013.01);
(Continued)

(58) Field of Classification Search
CPC ......... H01L 25/07; H01L 25/18; H01L 23/28; H01L 23/053; H01L 25/071; H01L 25/50; H05K 3/0011

See application file for complete search history.

(56) References Cited

U.S. PATENT DOCUMENTS 4,908,738 A    3/1990  Kobari et al.
9,153,512 B2 * 10/2015  Terai ....................... H01L 25/07
(Continued)

FOREIGN PATENT DOCUMENTS

| JP | H10-093016 A | 4/1998 |
| JP | 2000-068446 A | 3/2000 |
| JP | 2000-208655 A | 8/2000 |
| JP | 2004-281727 A | 10/2004 |
| JP | 2005-050974 A | 2/2005 |
| JP | 2005-123219 A | 5/2005 |
| JP | 2006-066427 A | 3/2006 |
| JP | 2008-252055 A | 10/2008 |

(Continued)

OTHER PUBLICATIONS

PCT, "International Search Report for International Application No. PCT/JP2014/082632".

(Continued)

*Primary Examiner* — Adrian S Wilson
*Assistant Examiner* — Abhishek Rathod
(74) *Attorney, Agent, or Firm* — Manabu Kanesaka (57) ABSTRACT

A semiconductor module includes a plurality of insulating circuit boards including semiconductor chips, each of the plurality of insulating circuit boards including a first outer edge among outer edges of the insulating circuit board facing an adjacent insulating circuit board of the plurality of insulating circuit boards, and a second outer edge among the outer edges excluding the first outer edge; a resin frame body having a crosspiece abutting against the first outer edges, and a frame element abutting against the second outer edges; a conductive component striding over the crosspiece to electrically connect the insulating circuit boards to each other; and an upper lid having a lid element covering an opening disposed at an upper part of the resin frame body and a partition protruding from a face of the lid element facing the insulating circuit boards to abut against a part of the crosspiece.

5 Claims, 4 Drawing Sheets (51) Int. Cl.
*H01L 25/07* (2006.01)
*H01L 25/18* (2006.01)
*H01L 23/24* (2006.01)
*H01L 21/52* (2006.01)
*H01L 23/08* (2006.01)
*H01L 23/498* (2006.01)
*H01L 25/00* (2006.01)
*H05K 3/00* (2006.01)
*H05K 3/30* (2006.01)
*H05K 3/46* (2006.01)

(52) U.S. Cl.
CPC ........ *H01L 23/28* (2013.01); *H01L 23/49838* (2013.01); *H01L 25/07* (2013.01); *H01L 25/071* (2013.01); *H01L 25/18* (2013.01); *H01L 25/50* (2013.01); *H05K 3/0011* (2013.01); *H05K 3/303* (2013.01); *H05K 3/46* (2013.01); *H01L 2224/48137* (2013.01); *H01L 2924/13055* (2013.01); *H01L 2924/19107* (2013.01)

(56) References Cited

U.S. PATENT DOCUMENTS

| | | | |
|---|---|---|---|
| 2007/0246825 A1* | 10/2007 | Oh | H01L 23/3121 257/728 |
| 2008/0142948 A1 | 6/2008 | Matsumoto | |
| 2008/0217760 A1 | 9/2008 | Yoshihara et al. | |
| 2010/0127371 A1 | 5/2010 | Tschirbs | |
| 2011/0284900 A1 | 11/2011 | Kim | |
| 2015/0043189 A1* | 2/2015 | Kitazaki | H01L 23/3121 361/816 |

FOREIGN PATENT DOCUMENTS

| | | |
|---|---|---|
| JP | 2010-130015 A | 6/2010 |
| JP | 2011-199213 A | 10/2011 |

OTHER PUBLICATIONS

Europe Patent Office, "Search Report for European Patent Application No. 14879151.0," Jan. 24, 2017.

* cited by examiner

SEMICONDUCTOR MODULE

CROSS-REFERENCES TO RELATED APPLICATIONS

The present application is a Continuation Application of PCT International Application No. PCT/JP2014/082632 filed Dec. 10, 2014, claiming priority from Japanese Application No. 2014-006436 filed Jan. 17, 2014, the disclosure of which is incorporated herein.

TECHNICAL FIELD

The invention relates to a semiconductor module that accommodates a circuit formed by using a plurality of insulating circuit boards in a case with a lid.

BACKGROUND ART

A structure that a shielding plate is disposed at the center portion of one board accommodated in a case is known in Patent Literature 1. The following descriptions are referred in Patent Literature 1: an optical receiving IC and an amplifier IC are mounted on one board, which has right and left notches at the center section between the optical receiving IC and the amplifier IC; a notch is formed at a portion facing a signal line on the bottom face of the shielding plate in order to avoid abutting against the signal line provided on the board; and the shielding plate is inserted so as to be engaged with the board through the whole thickness at the notch parts. A lid is disposed on the case and the shielding plate.

Further, a power semiconductor module is described in Patent Literature 2: a protrusion is disposed on the backside of a lid plate to press a control circuit printed board from the upper side so that the printed board is suppressed from shifting up and a stress generated in a solder joined part where a lead pin is connected to the printed board is relaxed.

Moreover, as a reference of a terminal, a semiconductor module including a plurality of semiconductor chips, bonding wires, a resin case, and external lead-out metal terminals (hereinafter, metal terminals), which are insert-molded in the resin case, is described in Patent Literature 3. The metal terminals are insert-molded at an outer peripheral frame of the resin case to enlarge an inside space of the case, and wiring is carried out by using only bonding wires between two parts such as an insulating circuit board, a semiconductor chip and a terminal so the metal terminal is not joined directly with solder on the insulating circuit board in the structure. The structure demands that the metal terminal is surely fixed with the resin case. If the metal terminal is not fixed properly on the resin case, connection failure may occur when wire bonding is performed to the metal terminal. Then, in conventional art, the fixing between the metal terminal and the resin case has been strengthened by providing convex parts protruding outside at the bottom part of the metal terminal bent in an L-shape, and forming the corresponding part of the resin case in a step-wise in order to support the metal terminal surely at the bottom part where wire bonding is performed.

CITATION LIST

Patent Literature

Patent Literature 1: JP-A No. 2005-50974
Patent Literature 2: JP-A No. 2000-68446
Patent Literature 3: JP-A No. 2000-208655

DISCLOSURE OF INVENTION

Problem to be Solved by the Invention

Figure 6:
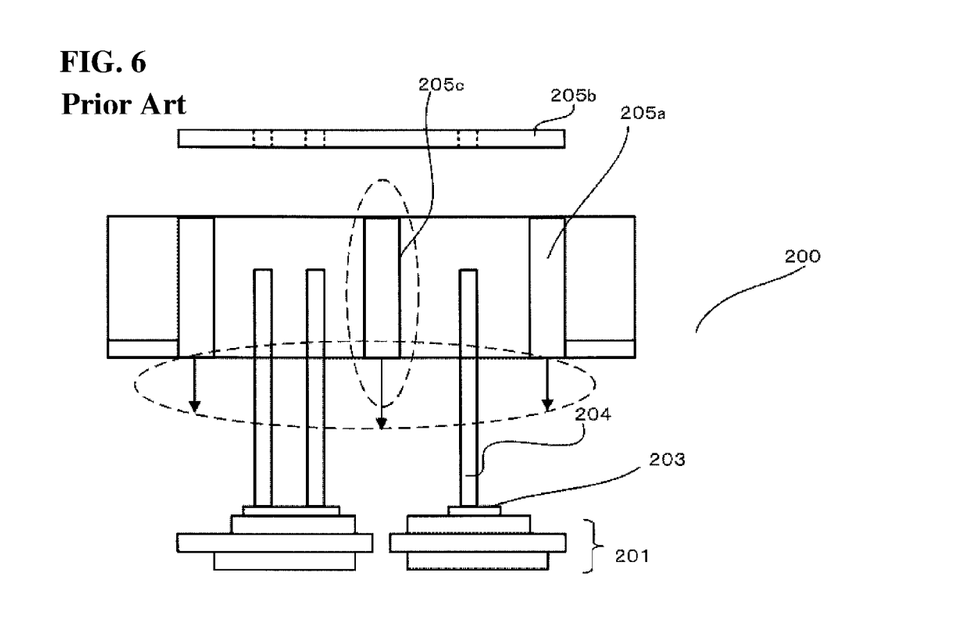
FIG. 6 is a schematic cross sectional view illustrating an outline structure of a conventional semiconductor module employing a plurality of insulating circuit boards.

In a semiconductor module employing one sheet of insulating circuit board, an area necessary for the insulating circuit board increases when a semiconductor chip becomes bigger in size, and the number of chips increases further. If the insulating circuit board area increases excessively, warp and crack might occur in the insulating circuit board due to stress caused by the difference in coefficients of thermal expansion. Thus, in a case that the insulating circuit board becomes bigger further, a structure in which one sheet of insulating circuit board is divided into a plurality of insulating circuit boards, which is assembled to make another structure, is used for decreasing the effect of warp from the insulating circuit boards to improve adhesion between the insulating circuit boards and a heat sink. However, there is no description in the above references regarding a semiconductor module wherein a plurality of insulating circuit boards, which forms a circuit, is accommodated in a case with a lid, and each one of all peripheries of the plurality of insulating circuit boards is pressed and then fixed from the upper side. As shown in FIG. 6, if a structure has not just an outer frame of a resin case 205a but also a wall 205c, which is disposed around the center part, holding a periphery of insulating circuit boards 201, there is a problem that connection between insulating circuit boards 201 cannot be performed by using bonding wires because the wall 205c becomes a barrier.

Furthermore, in the case that the metal terminal has convex parts outside as described above in Patent Literature 3, there is a problem that the production number of metal terminals per unit area of a metal plate decreases when the metal terminals are manufactured from the metal plate being raw material.

In view of the problems mentioned above, it is an object of the present invention to provide a semiconductor module that can readily achieve connection between insulating circuit boards electrically and suppress warpage deformation to radiate heat produced from semiconductor chips efficiently, even though the structure is formed so as to have the plurality of insulating circuit boards.

Means for Solving Problems

In order to solve the problem described above and to attain the object of the invention, according to an aspect of the invention, there is provided a semiconductor module comprising a plurality of insulating circuit boards which includes semiconductor chips; a resin frame body which has a crosspiece abutting against first outer edges of the insulating circuit boards in which the first outer edge among outer edges of one of the insulating circuit board faces an adjacent insulating circuit board, and a frame element abutting against second outer edges of the insulating circuit boards which exclude the first outer edges among the outer edges of the insulating circuit boards; a conductive component which achieves connection between the insulating circuit boards electrically so that the conductive component strides over the crosspiece; and an upper lid which has a lid element covering an opening disposed at an upper part of the resin frame body and a partition protruding from the lid element whose face facing the insulating circuit boards and abutting against a part of the crosspiece.

According to the above aspect of the invention, without being obstructed by the partition, the conductive component can stride over the crosspiece to achieve the connection between the insulating circuit boards electrically. Further, the partition disposed on the upper lid can press the crosspiece of the resin frame body, and the crosspiece can press the first outer edges of the insulating circuit boards so that the insulating circuit board is suppressed from warping.

In the semiconductor module according to the above aspect of the invention, the upper lid preferably includes a columnar part which abuts the insulating circuit board, wherein the columnar part protrudes from the lid element whose face is facing the insulating circuit boards.

According to the structure described above, the columnar part of the upper lid can press the center portion of the insulating circuit board so that the insulating circuit board is suppressed from warping. In addition, the upper lid may be bonded to the resin frame body, so the upper lid can be easily attached to the resin frame body. Moreover, the structure may also have an engagement portion which can fix the upper lid to the resin frame body, so the upper lid can be more easily attached to the resin frame body.

In the semiconductor module according to the above aspect of the invention, the resin frame body preferably includes a stepped section disposed along an inside wall of the resin frame body, and a metal terminal which has a shaft, a leg, and a hinge portion, which is bent, coupling the shaft to the leg with narrower width than the shaft or the leg, wherein the leg is preferably disposed on the upper face of the stepped section.

According to the structure described above, the hinge portion is formed narrower in width than at least one of the shaft and leg or both of them, to engage with the resin frame body, and the leg bent from the hinge portion can be fixed on the upper face of the stepped section so that the displacement between the metal terminal and the resin frame body is suppressed. Further, the hinge portion of the metal terminal, which engages the resin frame body, has a shape narrower than the overall width of the metal terminal so that when the metal terminals are manufactured by press working, a layout is made with a narrower pitch, the quantity of end materials decreases, and and the production number of metal terminals per unit area increases.

In the semiconductor module according to the above aspect of the present invention, in a state where a part of the shaft and a part of the leg are exposed, the metal terminal is preferably embedded in the frame element of the resin frame body.

According to the structure described above, the shaft of the metal terminal is embedded in the resin frame body, and only the leg of the metal terminal, which become a point connecting a bonding wire, is exposed so that the wire bonding operation can be performed easily. This results in a connection having high reliability.

According to another aspect of the invention, there is provided a method for manufacturing a semiconductor module, wherein the semiconductor module comprises a plurality of insulating circuit boards which includes semiconductor chips, a resin frame body which has a crosspiece abutting against first outer edges of the insulating circuit boards in which a first outer edge among outer edges thereof is facing the adjacent insulating circuit board and a frame element abutting against second outer edges which exclude the first outer edges from the outer edges of the insulating circuit boards, a conductive component which achieves connection between the insulating circuit boards electrically so that the conductive component strides over the crosspiece, and an upper lid which has a lid element covering an opening disposed at an upper part of the resin frame body and a partition protruding from the lid element whose face is facing the insulating circuit boards and abutting a part of the crosspiece. The method comprises a first step of disposing the insulating circuit boards and the resin frame body so that the crosspiece abuts against the first outer edges, and the frame element abuts the second outer edges, a second step of achieving the connection between the insulating circuit boards electrically with the conductive component so that the conductive component strides over the crosspiece, and a third step of fixing the upper lid to the resin frame body so that the lid element of the upper lid covers the opening disposed at the upper part of the resin frame body, and the partition disposed on the upper lid abuts a part of the crosspiece.

According to the above aspect of the invention, without being obstructed by the partition, the conductive component can stride over the crosspiece to achieve the connection between the insulating circuit boards electrically.

Effect of the Invention

According to the present invention, even though a semiconductor module has a structure with a plurality of insulating circuit boards, it is possible to provide the semiconductor module which can achieve the connection electrically between the insulating circuit boards easily and suppress the insulating circuit boards from warpage deformation to radiate heat produced from semiconductor chips efficiently.

MODES FOR CARRYING OUT THE INVENTION

Hereinafter, preferred embodiments of a semiconductor module according to the invention will be described in detail with reference to the accompanying drawings. In addition, in the following description of the embodiments and accompanying drawings, the same constituent elements will be denoted by the same reference numerals, and redundant descriptions thereof will be omitted. Furthermore, the accompanying figures described in the embodiments are not drawn by using accurate scale and proportion for the sake of being easily recognized or surely understood. The invention is not limited to the details of the embodiments described hereinafter, provided that it does not exceed the gist thereof.

Figure 1:
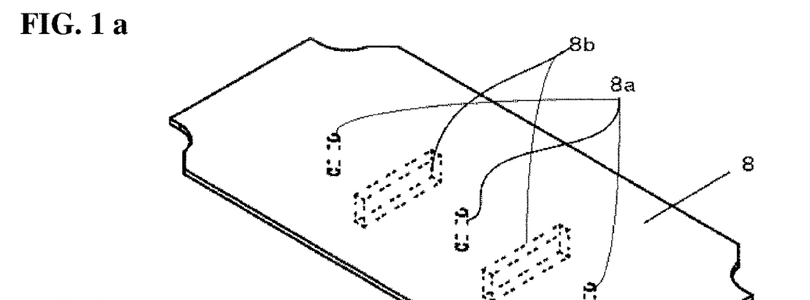
FIGS. 1a-1c are perspective views illustrating a part of a semiconductor module in which the semiconductor module is not assembled yet according to an embodiment of the present invention.

FIGS. 1a-1c are perspective views illustrating a part of the semiconductor module in which the semiconductor module is not assembled yet according to an embodiment of the present invention.

FIG. 1a shows a perspective view of an upper lid 8. The upper lid 8 includes a partition 8b and a columnar part 8a. The partition 8b and the columnar part 8a are disposed to the upper lid 8 whose side faces to an insulating circuit board 9. The partition 8b presses a part of a crosspiece 5a of a resin frame body 5 shown in FIG. 1b. Each one of the columnar parts 8a presses each one of the insulating circuit boards 9 at respective center parts shown in FIG. 1c.

FIG. 1b shows the resin frame body 5 in which metal terminals 4a and 4b are insert-molded in a frame element 5c. The resin frame body 5 includes the crosspiece 5a, the frame element 5c, and a stepped section 5e. An aperture 5b, which is surrounded by the crosspiece 5a and the frame element 5c, has an open hole. The stepped section 5e is disposed along the inside wall of the resin frame body 5, and the upper face of the stepped section 5 forms a face on which the metal terminals 4a and 4b are disposed. The resin frame body 5 includes a through-hole 6 for fixing the semiconductor module to a heat sink not shown. A material for forming the resin frame body 5 and the upper lid 8 is preferably selected from a poly(phenylene sulfide) resin (PPS resin), a polyamide resin (PA resin), an acrylonitrile-butadiene-styrene resin (ABS resin), a poly(butylene terephthalate) resin, and the like.

Figure 3:
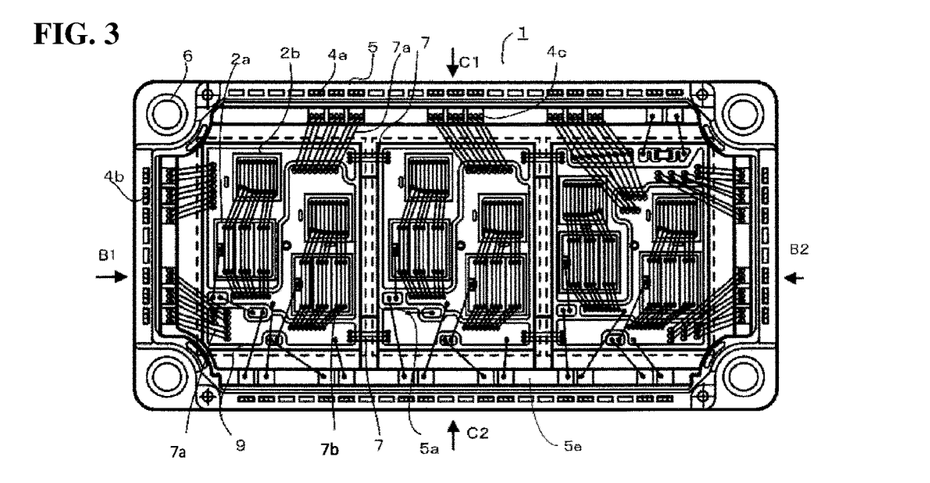
FIG. 3 is a top view illustrating a state where the resin frame body 5 has been mounted on the insulating circuit boards in which semiconductor chips have been mounted as shown in FIG. 2, and then bonding wires (conductive components) 7 have been connected.

FIG. 1c shows an insulating circuit board 9 in which semiconductor chips and bonding wires (conductive components) are omitted. Known insulating ceramics such as alumina, aluminum nitride, and silicon nitride can be employed for the insulating circuit board 9. A circuit pattern 9a having copper foil or the like is connected to each front surface of the insulating circuit boards 9, and the copper foil is connected to each entire back surface but periphery of the insulating circuit boards 9. As shown in FIG. 3 described later, semiconductor chips 2a and 2b such as an insulated gate bipolar transistor (IGBT) and a free-wheeling diode (FWD) are mounted so as to be joined with solder on the circuit pattern 9a.

Figure 2:
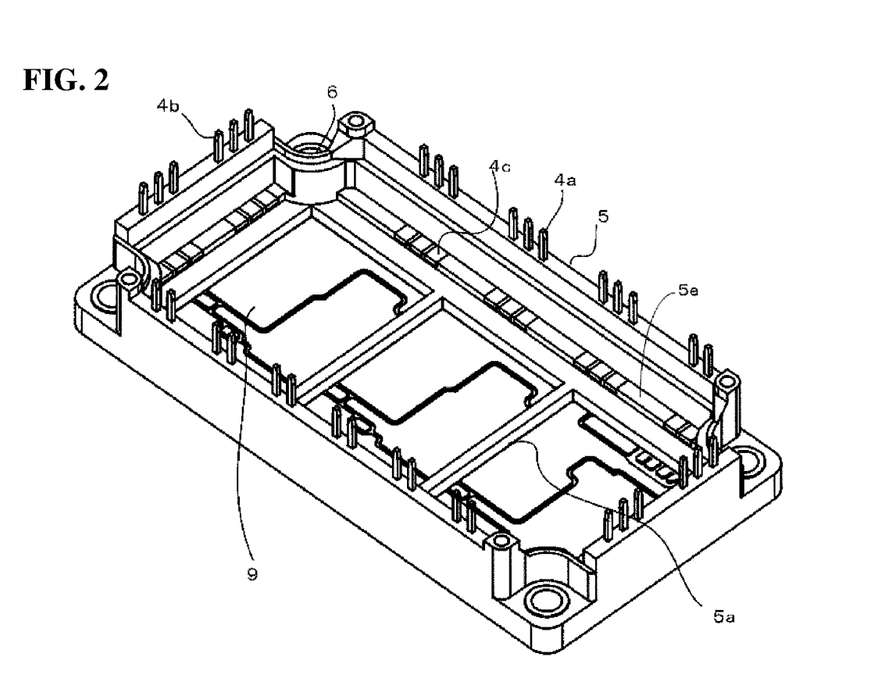
FIG. 2 illustrates a disassembled perspective view in a state where a resin frame body 5 shown in FIG. 1b is mounted on insulating circuit boards 9 shown in FIG. 1c.

FIG. 2 shows a perspective view in a state where the resin frame body 5 shown in FIG. 1b is mounted on the insulating circuit boards 9 shown in FIG. 1c. The metal terminals 4a and 4b are embedded in the resin frame body 5. A leg 4c of the metal terminal is disposed on the upper face of the stepped section 5e so as to be extended from the resin frame body 5. The upper face of the stepped section 5e may be flat or may have recessed parts engaging the legs of the metal terminals 4a and 4b as shown in the figure. This can fix the metal terminals 4a and 4b surely and prevent displacement. The size of the aperture 5b disposed at the center of the resin frame body 5 is formed slightly smaller than that of the insulating circuit board, so that the resin frame body 5 can press constantly to bond the periphery of the insulating circuit board 9. The crosspiece 5a of the resin frame body 5 presses the vicinity of the outer edges of the insulating circuit boards 9 adjacent to each other to bond.

FIG. 3 shows a top view illustrating a state where the resin frame body 5 has been mounted on the insulating circuit boards in which semiconductor chips have been mounted as shown in FIG. 2, and then bonding wires (conductive components) 7 have been connected. The semiconductor chips 2a and 2b such as an IGBT and a FWD are connected to the circuit pattern 9a through solder. Then, bonding wires 7a and 7b are applied so as to connect two parts such as between the semiconductor chips 2a and 2b and between the insulating circuit board and the leg 4c of the metal terminal in order to constitute a desired inverter circuit and the like. Further the bonding wire 7, striding over the crosspiece 5a of the resin frame body 5, is applied on the faces between the circuit patterns 9a, so this achieves the electrical connection between the insulating circuit boards 9 being adjacent to each other. In addition, the conductive components not being limited to the bonding wire described above may be a flat plate-like material.

Figure 4:
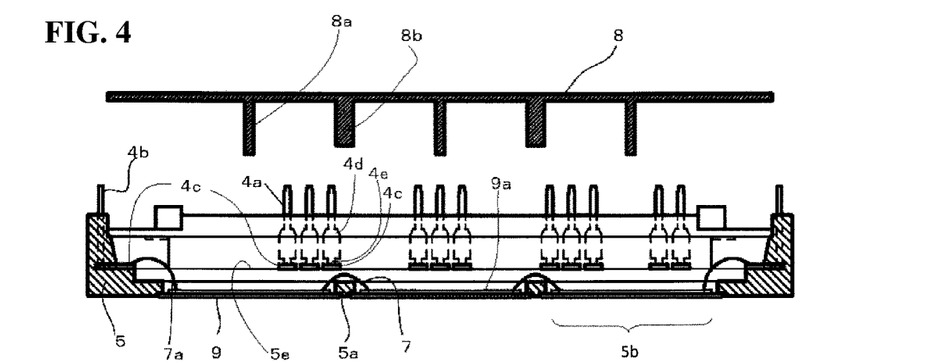
FIG. 4 is a cross sectional view along the line B1-B2 in FIG. 3 with a cross sectional view of an upper lid 8. Semiconductor chips and bonding wires 7a and 7b around the chips, and the like are partly omitted.

FIG. 4 is a cross sectional view along the line B1-B2 in FIG. 3 with a cross section view of the upper lid 8. The semiconductor chips and the bonding wires 7a and 7b, and the like are partly omitted to be recognized easily. Each one of the metal terminals 4a and 4b includes a shaft 4d, the leg 4c, and a hinge portion 4e, which is bent, coupling the shaft 4d to the leg 4c. The hinge portion 4e has a narrower width than the shaft 4d or the leg 4c and engages with the resin frame body 5. The leg 4c bent from the hinge portion 4e is fixed to the stepped section 5e, so that the displacement between the metal terminal 4a or 4b and the resin frame body 5 may be suppressed.

In addition, the metal terminals 4a and 4b according to the present invention have a shape in which a width of the hinge portion 4e engaging with the resin frame body 5 is narrower than that of the shaft 4d or the leg 4c. Therefore, when the metal terminals are manufactured by press working, a layout is made with a narrower pitch, the quantity of end materials decreases and the production number of metal terminals per unit area increases.

The semiconductor module illustrated in the cross section view of FIG. 4 holds the metal terminals 4a and 4b which are molded integrally in a state where each part of the legs 4c of the metal terminals 4a and 4b is exposed on the flat upper face of the stepped section 5e which is located inside the resin frame body 5, and each part of the shafts 4d is led outside. However, the metal terminals 4a and 4b may not be necessarily molded integrally into the resin frame body 5. The metal terminals may be inserted integrally by engaging with a molded resin frame body. As mentioned above, the metal terminals 4a and 4b are collected to the resin frame body 5 locating outside the area where wire bonding lines are formed, and only the legs 4c which are bent in an L-shape at the hinge portion are exposed on the stepped section 5e inside the resin frame body 5 so that the shafts 4d of the metal terminals are embedded in the resin frame body 5, and only the legs of the metal terminals which become points connecting bonding wires are exposed. Therefore, the wire bonding operation becomes easier and achieving a connection with higher reliability is possible.

Figure 5:
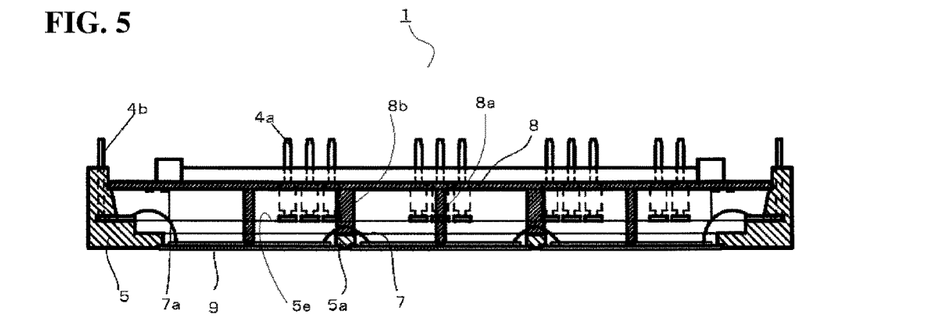
FIG. 5 shows a cross sectional view along the line B1-B2 in a state where the upper lid 8 is set to a proper position. Similar to FIG. 4, the semiconductor chips and the bonding wires 7a and 7b around the chips, and the like are partly omitted.

FIG. 5 shows a cross sectional view along the line B1-B2 in a state where the upper lid 8 shown in FIG. 4 is set to a proper position. The semiconductor chips, the bonding wires 7a and 7b around the chips, and the like are partially omitted as similar to FIG. 4. As shown in FIG. 1a using a broken line, the partition 8b and the columnar part 8a are provided on the lower side of the upper lid 8. As shown in FIGS. 4 and 5, the partition 8b is disposed so as to press the upper face of the crosspiece 5a provided in the resin frame body 5 when an opening disposed at an upper part of the resin frame body 5 is covered with the upper lid 8. The columnar part 8a is disposed so that the insulating circuit board 9 is pressed near the central part.

However, as described earlier, there is a place where the bonding wire 7 strides over the crosspiece 5a of the resin frame body 5 and achieves connection so that if the bottom face of the partition 8b is set to the same dimension as the top face of the crosspiece 5a, the partition 8b shall interfere with the bonding wire 7. Therefore, the present invention has a feature in which the partition 8b disposed on the upper lid 8 has a shape avoiding interference with the bonding wire 7. As the bonding wires 7 are, for example, shown in FIG. 3, if the bonding wires 7 are disposed at positions being in the vicinity of both edges of the insulating circuit boards 9, the partition 8b is formed to have the shape in which the partition 8b is contacting the crosspiece 5a at only a part of the top face interposed between the bonding wires 7 so that the partition 8b avoids contacting the bonding wire 7. As mentioned above, even though the dimension of the partition 8b is formed to be shorter in shape than that of the crosspiece 5a positioning at the lower side so as not to contact the bonding wire 7, the partition 8b presses the insulating circuit board 9 through the crosspiece 5a. Then, with regard to the plurality of insulating circuit boards 9, each peripheral edge of insulating circuit boards 9 will equally contact the crosspiece 5a and the frame element 5c which are outer peripheries of the resin frame body 5 to provide pressure force almost uniformly toward the insulating circuit boards 9. The plurality of insulating circuit boards 9 is bonded to the frame element 5c and the crosspieces 5a of the resin frame body 5 on the lower faces with adhesion material. As a result, warpage deformation of the insulating circuit board 9 in a semiconductor module 1 is suppressed. A heat sink, in which a face facing the back face of the insulating circuit board 9 is formed so as to have a flat surface, is contacting each backside copper foil of the plurality of insulating circuit boards 9. Screw grooves are formed in the flat surface, and the resin frame body 5 is fixed to the heat sink with screws threading through the through-hole 6. Therefore it is possible to radiate heat produced from the semiconductor chips 2a and 2b to the heat sink not shown. Further with regard to the upper lid 8, the partition 8b presses the insulating circuit board 9 through the crosspiece 5a so the length of the partition 8b determined from the upper lid 8 will become shorter than that of the columnar part 8a determined from the upper lid 8. This also provides a feature in structure of one aspect of the embodiment described above.

As shown in the perspective views of FIGS. 1a-1c and 2 and in the top view of FIG. 3, the semiconductor module 1 according to the present invention comprises the plurality of insulating circuit boards 9 which is adjacent to each other and arranged in line, the resin frame body 5 bonded on the periphery of the insulating circuit boards 9, and the upper lid 8 which closes the opening disposed at an upper side of the resin frame body 5. For a method to cover the opening disposed at the upper part of the resin frame body 5 with the upper lid 8, the upper lid 8 may be bonded to the resin frame body 5 with adhesion material. Further, another method may be performed so as to provide an engagement portion where the upper lid 8 is fixed to the resin frame body 5. The engagement portion may have a structure such as interlocking, a screw stopper, or mesh. This can ensure that the pressure force is provided from the columnar part 8a and the partition 8b disposed on the upper lid 8 toward the insulating circuit board 9.

A method for manufacturing the semiconductor module 1 according to the present invention comprises a first step of disposing the insulating circuit boards 9 and the resin frame body 5 so that the crosspiece 5a is disposed on first outer edges of the insulating circuit boards 9 which are facing each other, and the frame element 5c of the resin frame body 5 is disposed on second outer edges of the plurality of insulating circuit boards 9, a second step of achieving the connection between the insulating circuit boards 9 electrically with the conductive components 7 so as to stride over the crosspiece 5a, and a third step of fixing the upper lid 8 to the resin frame body 5 so that the lid element 8c of the upper lid 8 covers the opening disposing at the upper part of the resin frame body, and the partition 8b disposed on the upper lid 8 abuts a part of the crosspiece 5a. Before the upper lid 8 covers the resin frame body 5 in the third step, it is more preferable to include another step in which silicone gel or the like is injected to seal the inside empty space surrounded by the resin frame body 5 and the insulating circuit boards 9.

As mentioned above, according to the embodiment of the present invention, even though the semiconductor module has the structure with the plurality of insulating circuit boards, there is provided the semiconductor module which enables to achieve easily the connection between the insulating circuit boards electrically and to radiate heat produced from the semiconductor chips efficiently under suppression of warpage deformation of the insulating circuit boards.

EXPLANATIONS OF LETTERS OR NUMERALS

1: semiconductor module
2a, 2b: semiconductor chip
4a, 4b: metal terminal
4c: leg of metal terminal
4d: shaft of metal terminal
4e: hinge portion of metal terminal
5: resin frame body
5a: crosspiece
5b: aperture
5c: frame element
5d: engagement portion located at resin frame body side
5e: stepped section
6: through-hole
7, 7a: bonding wire (conductive component)
8: upper lid
8a: columnar part
8b: partition
8c: lid element
8d: engagement portion located at upper lid side
9: insulating circuit board
9a: circuit pattern
200: semiconductor module
201: insulating circuit board
203: semiconductor chip
204: external lead-out metal terminal
205a: resin case
205b: upper lid
205c: wall

What is claimed is:
1. A semiconductor module comprising:
a plurality of insulating circuit boards including semiconductor chips, each of the plurality of insulating circuit boards including a first outer edge among outer edges of the insulating circuit board facing an adjacent insulating circuit board of the plurality of insulating circuit boards, and a second outer edge among the outer edges of the insulating circuit board excluding the first outer edge;

a resin frame body having a crosspiece abutting against the first outer edges of the plurality of insulating circuit boards, and a frame element abutting against the second outer edges of the plurality of insulating circuit boards;

a conductive component striding over the crosspiece to electrically connect the insulating circuit boards to each other; and an upper lid having a lid element covering an opening disposed at an upper part of the resin frame body, and a partition protruding from a face of the lid element facing the insulating circuit boards and abutting against a part of the crosspiece.

2. The semiconductor module according to claim 1, wherein the upper lid further includes a columnar part protruding from the face of the lid element facing the insulating circuit boards and abutting against the insulating circuit board.

3. The semiconductor module according to claim 1, wherein the resin frame body further includes a stepped section disposed along an inside wall of the resin frame body, and a metal terminal having a leg disposed on an upper face of the stepped section, a shaft, and a hinge portion bent to couple the shaft to the leg and having a width narrower than that of the shaft or the leg.

4. The semiconductor module according to claim 3, wherein the metal terminal is embedded in the frame element of the resin frame body in a state in which a part of the shaft and a part of the leg are exposed.

5. A method for manufacturing a semiconductor module, comprising:

preparing the semiconductor module comprising a plurality of insulating circuit boards including semiconductor chips, each of the plurality of insulating circuit boards including a first outer edge among outer edges of the insulating circuit board facing an adjacent insulating circuit board of the plurality of insulating circuit boards, and a second outer edge among the outer edges of the insulating circuit board excluding the first outer edge; a resin frame body having a crosspiece to abut against the first outer edges of the insulating circuit boards, and a frame element to abut against the second outer edges of the insulating circuit boards; a conductive component to stride over the crosspiece to electrically connect the insulating circuit boards; and an upper lid having a lid element to cover an opening disposed at an upper part of the resin frame body and a partition protruding from a face of the lid element to face the insulating circuit boards to abut a part of the crosspiece, disposing the insulating circuit boards and the resin frame body so that the crosspiece abuts against the first outer edges, and the frame element abuts against the second outer edges;

electrically connecting the insulating circuit boards to each other with the conductive component striding over the crosspiece; and fixing the upper lid to the resin frame body to cover the opening disposed at the upper part of the resin frame body with the lid element of the upper lid, and to allow the partition disposed on the upper lid to abut against a part of the crosspiece.

* * * * *